United States Patent [19]

Yamamoto et al.

[11] Patent Number: 4,791,369

[45] Date of Patent: Dec. 13, 1988

[54] METHOD OF MEASURING MAGNETIC FIELD ERROR OF AN NMR IMAGING APPARATUS AND OF CORRECTING DISTORTION CAUSED BY THE ERROR

[75] Inventors: Etsuji Yamamoto, Akishima; Hideki Kohno, Suginami, both of Japan

[73] Assignee: Hitachi, Ltd., Tokyo, Japan

[21] Appl. No.: 72,035

[22] Filed: Jul. 10, 1987

[30] Foreign Application Priority Data

Jul. 14, 1986 [JP] Japan ................................ 61-163615

[51] Int. Cl.$^4$ ............................................ G01R 33/20
[52] U.S. Cl. ...................................... 324/312; 324/308
[58] Field of Search ............... 324/307, 308, 309, 312; 128/653

[56] References Cited

U.S. PATENT DOCUMENTS

| | | | |
|---|---|---|---|
| 4,661,775 | 4/1987 | Kormos et al. | 324/312 |
| 4,684,889 | 8/1987 | Yamaguchi et al. | 324/308 |
| 4,713,614 | 12/1987 | Hoshino et al. | 324/309 |

OTHER PUBLICATIONS

Maudsley, A. A. et al., "Magnetic Field Measurement by NMR Imaging", J. Phys. E: Sci. Instrum., vol. 17, 1984.

Sekihara, K. et al., "A New Method . . . NMR Imaging", J. Phys. E: Sci. Instrum., vol. 18, 1985.

*Primary Examiner*—Stewart J. Levy
*Assistant Examiner*—Kevin D. O'Shea
*Attorney, Agent, or Firm*—Antonelli, Terry & Wands

[57] ABSTRACT

A method of finding error distribution in the static magnetic field and distribution of deviations from straight lines in the gradient magnetic fields of an NMR imaging apparatus which employs the applied spin-warp method. A phantom whose shape has been known is measured in the read-out gradient magnetic fields having different polarities to obtain two spin density distribution images. The two images are then compared with the shape of said phantom to measure the distortion distributions of the images. Error in the static magnetic field and deviations of the gradient magnetic fields from the straight lines are analyzed from the distortion distributions. From the thus obtained error distribution, furthermore, distortion induced in imaging the object is estimated, and the distortion contained in the image that is reconstructed from the spin density of the object by the spin-warp method is corrected using the thus estimated value.

9 Claims, 2 Drawing Sheets

FIG. 1
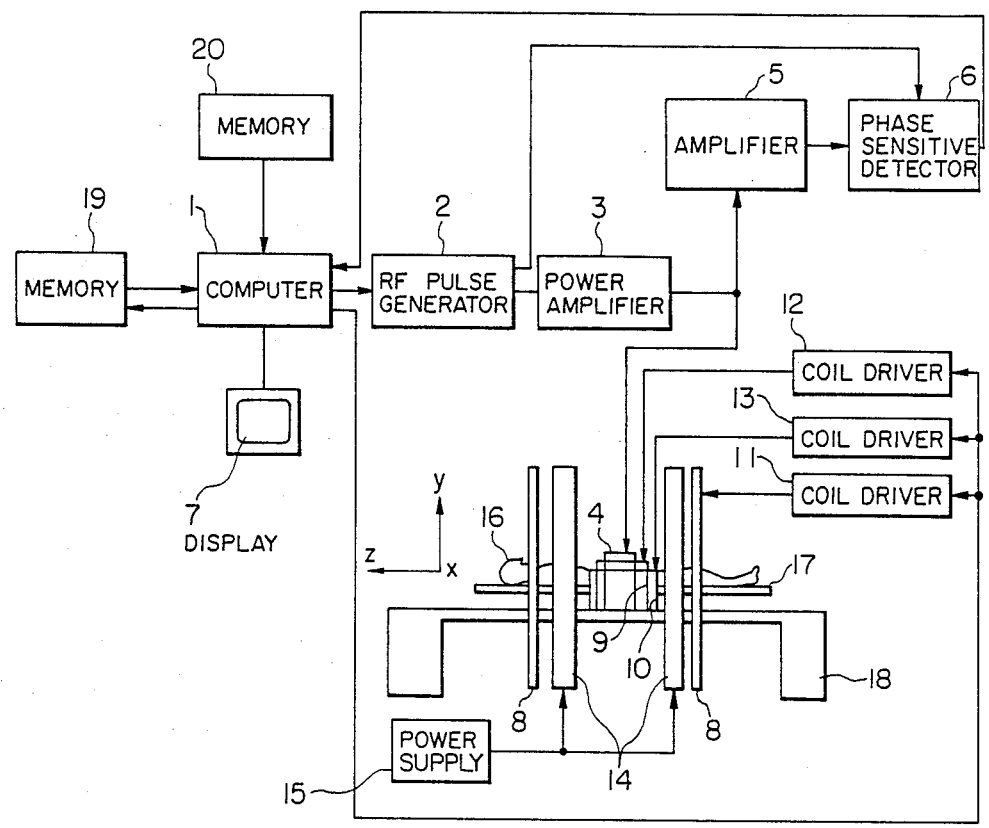
FIG. 2A  RF
FIG. 2B  Gz
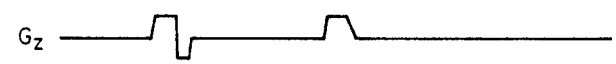
FIG. 2C  Gx
FIG. 2D  Gy
FIG. 2E  NMR SIGNAL

METHOD OF MEASURING MAGNETIC FIELD ERROR OF AN NMR IMAGING APPARATUS AND OF CORRECTING DISTORTION CAUSED BY THE ERROR

BACKGROUND OF THE INVENTION (i) Field of the Invention

The present invention relates to an imaging apparatus based upon nuclear magnetic resonance (hereinafter referred to as "NMR"), and more particularly to a method of separately measuring nonuniformity in a static magnetic field that deteriorates the picture quality and nonlinearity in the gradient magnetic fields, and to a method of perfectly and independently correcting the effects thereof.

(ii) Prior Art

In the imaging employing nuclear magnetic resonance phenomenon, signals from various portions of an object must be separated and discriminated depending upon the positions.

According to a method taught in U.S. Pat. No. 4,602,214, the separation and discrimination are effected relying upon the application of a read-out gradient magnetic field and a phase encoding gradient magnetic field.

In such an imaging, nonuniformity in the static magnetic field and nonlinearity in the gradient magnetic fields are main causes that deteriorate the picture quality.

The specification of U.S. patent application Ser. No. 600,159 that was filed on Apr. 13, 1984, now U.S. Pat. No. 4,672,320 and that was assigned to the same assignee as the present application, discloses a method which, when the distribution of nonuniformity in the static magnetic field and the distribution of deviation of gradient magnetic fields from a straight line have been known, corrects the signals that are measured relying upon these distributions and removes distortion from the image. Further, according to a method of measuring the distribution of nonuniformity in the static magnetic field by Maudsley et al., Journal of Physics E: Scientific Instrument, 17, 216, 1984, the distribution of nonuniformity in the static field can be found to a degree of picture element as a unit.

The inventors of the present application has already filed in Japan a patent application covering a method of finding nonlinearity in the gradient magnetic fields separately from the nonuniformity in the static magnetic field. This method has been disclosed in Japanese Patent Laid-Open No. 84550/1986. According to this method, the measurement is effected twice under read-out gradient magnetic fields of two dissimilar strengths using a phantom of which the shape has been known, in order to detect the deviation of the gradient magnetic fields from the straight lines based upon the distortion of the reproduced image. In practice, however, the amount of distortion in the reproduced image is so small relative to the amount of deviation of the gradient magnetic fields from the straight lines that it is difficult to detect the distribution of deviation maintaining high precision, and leaves a problem in that complex calculation is required for correction.

SUMMARY OF THE INVENTION

An object of the present invention is to provide a method of measuring static magnetic field error of an NMR imaging apparatus and measuring deviation of the gradient magnetic fields from the straight line maintaining high precision.

Another object of the present invention is to provide an NMR imaging method which is capable of correcting distortion induced by the imaging that is carried out by using a read-out gradient magnectic field of a given strength.

A first feature of the present invention resides in an imaging apparatus based upon a free imaging method, wherein in order to find error distribution in the static magnetic field in a visual field and distribution of deviation of the gradient magnetic fields from the straight lines, a phantom of which the spin density distribution has been known is subjected to the imaging using two read-out gradient magnetic fields having dissimilar polarities, and distributions of distortion of two reconstructed images are compared in order to separately detect the error distribution and the distribution of deviation from a straight line.

A second feature of the present invention resides in that the distribution of distortion of image that develops during the imaging of an object is estimated relying upon the error distribution in the static magnetic field and the distribution of deviation of the gradient magnetic fields from the straight lines, and the distortion in the image of spin density distribution of the object is corrected by using the estimated data.

BRIEF DESCRIPTION OF THE DRAWINGS

FIG. 1 is a block diagram of an apparatus dealt with in an embodiment of the present invention;

FIGS. 2A–2E is a time chart which illustrates the imaging method according to the embodiment;

DESCRIPTION OF THE PREFERRED EMBODIMENTS

Figure 3:
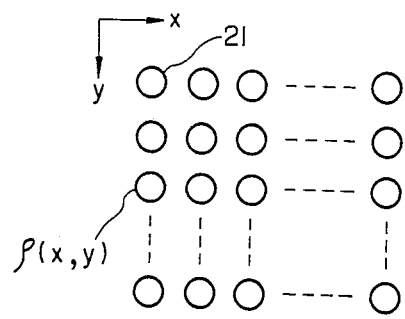
FIG. 3 is a diagram illustrating a phantom used in the embodiment.

FIG. 1 is a diagram illustrating the structure of an imaging apparatus according to an embodiment of the present invention, wherein reference numeral 1 denotes a computer, 2 denotes an RF pulse generator, 3 denotes a power amplifier, 4 denotes a coil which generates an RF magnetic field and which detects signals generated from an object 16, reference numeral 5 denotes an amplifier, 6 denotes a phase sensing detector, and 7 denotes a signal processing apparatus. Reference numerals 8, 9 and 10 denote gradient coils that generate gradient magnetic fields to impart gradient to the magnetic field strength in the z-, x- and y-directions that are at right angles with each other. Reference numerals 11, 12 and 13 denote coil drivers for driving the above-mentioned coils 8, 9 and 10.

The computer 1 has a function to produce a variety of instructions to various devices maintaining a predetermined timing. The output of the RF pulse generator 2 is amplified through the power amplifier 3 to excite the coil 4 which also works as a receiving coil as described in the foregoing. The signal components that are received pass through the amplifier 5, detected by the detector 6, input to the computer 1 so as to be processed, and are then converted into an image on the display 7.

The uniform static magnetic field is generated in the z-direction by the coil 14 that is energized by the power supply 15. The human body which is an object to be imaged is placed on a bed 17 that is constructed to move on a support plate 18.

Reference numerals 19 and 20 denote memory devices (hereinafter referred to as "memories").

First, described below are the principle of an applied spin-warp method and an example where the present invention is adapted to the two-dimensional applied spin-warp method in the case when the two-dimensional plane is to be imaged.

FIGS. 2A to 2E illustrate timings of RF magnetic field pulses and signals from the gradient magnetic fields in the x-, y- and z-directions and from the nuclear spins for putting the two-dimensional applied spin-warp method into practice. Here, a cross section in parallel with the xy plane is selected. FIG. 2A shows r-f magnetic field pulses, FIG. 2B shows a gradient magnetic field Gz in the z-direction, FIG. 2C shows a gradient magnetic field Gx in the x-direction, FIG. 2D shows a gradient magnetic field Gy in the y-direction, and FIG. 2E shows a signal from the nuclear spins.

First, a 90° RF pulse is irradiated in the presence of the gradient magnetic field Gz in the z-direction and, then nuclear spins are tilted by 90° in a particular slice in the specimen. Immediately, thereafter, there is applied for a time $t_x$ the gradient magnetic field $G_x$ that has a programmable strength-time product in order to encode the information of position in the x-direction onto the phase of the spin, followed by the irradiation with 180° RF pulses. The NMR signals are observed while applying the read-out gradient magnetic field Gy.

Such a measurement is repeated a plural number of times while changing the product of the strength of the gradient magnetic field Gx in the x-direction and the application time tx thereof, i.e., while changing the phase encoding amount. The drawings further illustrate an example in which the application time tx is maintained constant and the strength of the gradient magnetic field Gx is varied. There exists the following relation between a two-dimensional signal S(Gx, ty) obtained as a result of repetition and the nuclear spin distribution $\rho(x, y)$ in the slice, i.e., $$S(Gx, ty) = \int\int \rho(x, y)\exp\{-j\gamma(G_x x\, t_x + G_y y\, t_y)\} \quad (1)$$

Here, however, the equation (1) holds true only when the gradients of Gx and Gy are linear and the static magnetic field is uniform. As will be recognized from the equation (1), the image that represents the nuclear spin distribution $\rho(x, y)$ of the slice is reconstructed by subjecting the signal S(Gx, ty) to the two-dimensional inverse Fourier transform. In the foregoing was described the principle of the applied spin-warp method.

In this embodiment, for instance, a phantom consisting of the arrangement of rod-like samples 21 having a predetermined spin density shown in FIG. 3 is placed in the coil of FIG. 1, to effect the imaging using the measuring sequence in compliance with the above-mentioned applied spin-warp method. Here, first, use is made of the waveform of the read-out gradient magnetic field represented by a solid line in FIG. 2D. That is, when a signal is to be read, a gradient magnetic field Gy1 is applied so that the field gradient is applied in the positive direction along the y-direction, and the measurement is carried out repetitively. In the practical measurement, the static magnetic field contains an error as represented by E(x, y), and the gradient magnetic field in the x- and y-directions are given by Gx(x+$\epsilon_x$(x, Y)) and Gy1 (y+$\epsilon_y$(x, Y)). Symbols Gx and Gy1 represent quantities proportional to the electric currents that flow through the coils 9 and 10, and $\epsilon_x$(x, y) and $\epsilon_y$(x, y) represent deviation components from the straight line determined by the shapes of the coils 9 and 10. The data train obtained by this measurement is a two-dimensional signal obtained with a phase encode gradient magnetic field Gx and a time $t_y$ during one time of read shown in FIGS. 2A to 2D as parameters, and is denoted by $S_1(Gx, t_y)$. If the spin density distribution of the phantom is denoted by $\rho(x, y)$, the two-dimentional signal $S_1(x, y)$ is not given by the equation (1) but is given by the equation (2), $$S(Gx,\ t_y) = \int\int \rho(x,\ y)\exp\,[-j\gamma\{t_x(X + \epsilon_x(x,\ y))Gx + \quad (2)$$

$$(E(x,\ y) + G_y\epsilon_y(x,\ y) + G_y y)t_y\}]dxdy$$

where $\gamma$ denotes a gyromagnetic ratio.

After the measurement is finished, the two-dimensional signal $S_1(Gx, t_y)$ is subjected to the two-dimensional Fourier transform by the computer 1 to reconstruct a first spin density distribution image $\rho'(x', y')$. The data which represents the first reconstructed image is stored in the memory 19. There exists the following relationship between the coordinate (x', y') of the image $\rho'(x', y')$ and the coordinate (x, y) of a true density distribution $\rho(x, y)$, $$\left.\begin{array}{l}x' = x + \epsilon_x(x,\ y) \\ y' = y + \epsilon_y(x,\ y) + \dfrac{1}{G_{y1}}E(x,\ y)\end{array}\right\} \quad (3)$$

Figure 4:
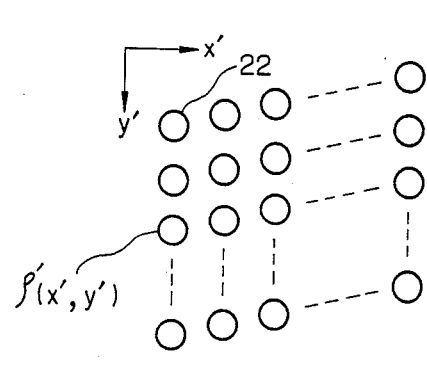
FIGS. 4 and 5 are diagrams illustrating reconstructed images of spin densities of the phantom.

This relationship is diagramed in FIG. 4 wherein the first reconstructed image is distorted being affected by error distribution E(x, y) in the static magnetic field, and deviations $\epsilon_x$(x, y) and $\epsilon_y$(x, y) of the gradient magnetic fields from the straight lines. The equation (3) which holds true can be verified if the equation (3) substituted for the equation (2), i.e., $$S(Gx,\ t_y) = \int\int \rho'(x',\ y')\exp\{-j\gamma(t_x x'\ Gx + t_y y'\ Gy)\}dx'\ dy' \quad (4)$$

Next, the read-out gradient magnetic field is set to be as represented by a broken line $-G_{y2}$ in FIG. 2D, and the sequence described with reference to FIGS. 2A to 2E is repeated to measure the same phantom. The obtained two-dimensional signal $S_2(Gx, t_y)$ is subjected to the two-dimensional Fourier transform by the computer 1 to reconstruct a second spin density distribution image $\rho''(x'', y'')$, and the data thereof is stored again in the memory 19. When the data is being read out, the gradient magnetic field in the y-direction that is applied is distributed in compliance with $-G_{y2}(y+\epsilon_y(x, y))$, and there holds the following relationship between (x'', y'') and (x, y), $$\left.\begin{array}{l}x'' = x + \epsilon_x(x,\ y) \\ y'' = y + \epsilon_y(x,\ y) - \dfrac{1}{G_{y2}}E(x,\ y)\end{array}\right\} \quad (5)$$

Figure 5:
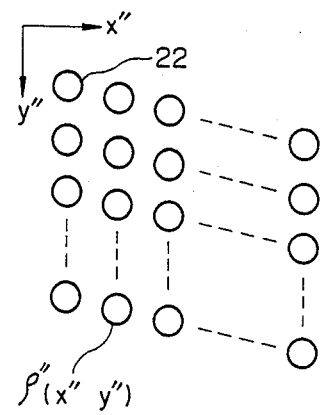

As shown in FIG. 5, therefore, the second reconstructed image is distorted differently from that of FIG. 4.

The read-out gradient magnetic fields $Gy_1$ and $Gy_2$ used for imaging the phantom twice should have the same strength $|Gy_1|=|Gy_2|$ but opposite directions. This is because, if $|Gy_1|\neq|Gy_2|$, then the first and second reconstructed images have visual fields that are different from each other. In the latter case, the time interval for sampling the NMR signal along the time $t_y$ of FIG. 2E should be set to be $|Gy_1|$ which is in reverse proportion to $|-Gy_2|$ so that the same visual field is obtained. Or, the obtained image should be expanded or contracted to obtain the same visual field. When $|Gy_1|=|-Gy_2|$, no such operation is required, as a matter of course.

Next, the error distribution $E(x, y)$ in the static magnetic field, distribution $\epsilon_x(x, y)$ of deviation of the gradient magnetic field Gx from the straight line and distribution $\epsilon_y(x, y)$ of deviation of the gradient magnetic field Gy from the straight line are found from the first reconstructed image $\rho'(x', y')$, the second reconstructed image $\rho''(x'', y'')$ and the true spin density distribution $\rho(x, y)$ which has been known in advance, for each of the points of the coordinate $(x, y)$. That is, the following three equations are obtained from the equations (3) and (5), $$E(x, y) = \frac{Gy_1 \cdot Gy_2}{Gy_1 + Gy_2}(y' - y'') \quad (6)$$

$$\epsilon_x(x, y) = x' - x = x'' - x \quad (7)$$

$$\epsilon_y(x, y) = \frac{Gy_1 \cdot y' + Gy_2 \cdot y''}{Gy_1 + Gy_2} - y \quad (8)$$

The equation (6) has a meaning in that an error distribution is obtained in the static magnetic field depending upon the difference in the distortion distribution in the y-direction between the first reconstructed image of FIG. 4 and the second reconstructed image of FIG. 5. Similarly, the equation (7) has a meaning in that the distribution of deviation of the gradient magnetic field Gx from the straight line in the x-direction is obtained from the distribution of distortion in the x-direction of either the first reconstructed image or the second reconstructed image. The equation (8) has a meaning in that deviation of the gradient magnetic field Gy from the straight line is obtained from the distributions of distortions in the y-direction of both the first and second reconstructed images. In a practical NMR imaging apparatus, the image is reconstructed based upon $N \times N$ discrete points, and the distribution of error in the magnetic field should be found for each of the picture element points (I, J)(I=0, 1, 2, ..., N-1, J=0, 1, 2, ..., N-1). Concretely speaking, the first reconstructed image $\rho'(x', y')$ and the second reconstructed image $\rho''(x'', y'')$ are successively displayed on the display 7, in order to read on which coordinates on the first reconstructed image and on the second reconstructed image the samples 21 of FIG. 3 exist, thereby to find values $x'$, $x''$, $y'$ and $y''$ that correspond to $x=I$, $y=J$. It is difficult to provide the samples 21 for all of the picture elements (I, J): generally, therefore, the samples 21 represent only limited number of picture element points. Therefore, positions of sample images 22 on the first reconstructed image and on the second reconstructed image are read out concerning the limited picture element points only, in order to find the values $x'$, $x''$, $y'$ and $y''$ and to find $x'$, $x''$, $y'$ and $y''$ concerning the remaining picture elements by interpolation based upon the above found values. Thus, the values $x'$, $x''$, $y'$ and $y''$ are found for all picture element points (I, J) and are substituted for the equations (6), (7) and (8), in order to find error distribution E(I, J) in the static magnetic field and distributions $\epsilon_x(I, J)$ and $\epsilon_y(I, J)$ of deviations of the gradient magnetic fields from the straight lines for each of the picture element points.

By imaging the phantom twice as mentioned above, there are obtained error distribution in the static magnetic field and distributions of deviations of the gradient magnetic fields from the straight lines in the x- and y-directions. When an object (e.g., human body) is to be imaged according to this embodiment, furthermore, the amount of image distortion caused by the error distribution is estimated in advance, and the distortion of image is corrected based upon the estimated amount of distortion. For this purpose, estimated values of image distortion corresponding to the read-out gradient magnetic field Gy of a given strength employed for imaging the object, are calculated for each of the picture element points and are stored in the memory 20. For instance, when a read-out gradient magnetic field $Gy_3$ is used for imaging the object, the spin density of a point (I, J) in a slice of the object appears on the reconstructed image at a coordinate $(\xi, \eta)$ given by, $$\left. \begin{array}{l} \xi = I + \epsilon_x(I, J) \\ \eta = J + \epsilon_y(I, J) + \dfrac{1}{Gy_3} E(I, J) \end{array} \right\} \quad (9)$$

The point $(\xi, \eta)$ does not necessarily come into agreement with any one of the $N \times N$ picture element points. In this embodiment, therefore, an image is found that is corrected by interpolation relying upon the data reproduced at four points that surrounds the point $(\xi, \eta)$. Concerning the values $\xi$ and $\eta$ at the points (I, J) calculated by substituting the values $\epsilon_y(I, J)$, E(I, J) and $\epsilon_x(I, J)$ for the equation (6), therefore, the following values, $$\left. \begin{array}{ll} i = [\xi] & j = [\eta] \\ \Delta_1 = \xi - i & \Delta_2 = \eta - i \end{array} \right\} \quad (10)$$

are found and are stored in the memory 20. Here, a symbol [] represents a maximum integer that does not exceed the value in the parenthesis.

Then, the object is placed in the coil of FIG. 1, measurement is taken by repeating the sequence mention with reference to FIGS. 2A to 2E by using the read-out gradient magnetic field $Gy_3$, the data $S_0(Gx, t_y)$ obtained is subjected to the two-dimensional Fourier transform to reconstruct a spin density distribution image $\rho_0'(x', y')$ of the object that includes distortion, and this image is stored in the memory 19.

Next, an interpolation value g is calculated in accordance with the following equation from the spin density $\rho_0'$ of four points (i, j), (i, j+1), (i+1, j) and (i+1, j+1) on the image $\rho_0'(x', y')$ for each picture element point using the data i, j, $\Delta_1$ and $\Delta_2$ that indicate an estimated distortion $(\xi, \eta)$ for each of the picture element points (I, J), i.e., calculated according to, $$g = (1 - \Delta_1) \cdot (1 - \Delta_2) \cdot \rho'_0(i, j) + (1 - \Delta_1) \cdot \Delta_2 \cdot \quad (11)$$

$$\rho'_0(i, j + 1) + \Delta_1 \cdot (1 - \Delta_1) \cdot \rho'_0(i, j + 1) + \Delta_1 \cdot \Delta_2 \cdot$$

$$\rho'_0(i + 1, j + 1)$$

The interpolation value $g = \rho_0(I, J)$ is calculated for all of the picture element points (I, J) and is stored again in the memory 19, and whereby an image is obtained in which distortion caused by the nonuniformity in the static magnetic field and the nonlinearity in the gradient magnetic fields is corrected.

Figure 6:
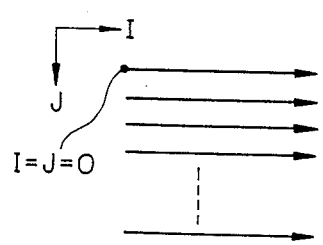
FIGS. 6 and 7 are schematic diagrams showing examples for finding the distortion of image by scanning.
Figure 7:
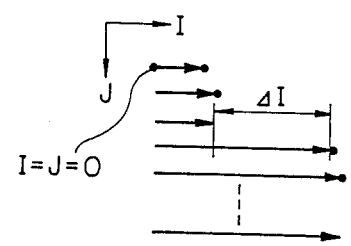

In the aforementioned embodiment, the correspondence of coordinates between the phantom of FIG. 3 and the reproduced images containing distortion of FIGS. 4 and 5 was determined on a screen. This determination, however, can be automatically carried out using a computer 1. This method will now be described. First, prior to taking the measurement, the frequency of the RF pulses or the strength of the static magnetic field is adjusted so that the center of the phantom is located at the center of the reproduced image. Under this condition, the measurement is taken by the applied spin-warp method using the read-out gradient magnetic field $G_{y1}$, and the image consisting of N points on the abscissa and N points on the ordinate as shown in FIG. 4 is stored in the memory 19. In a first step, the scanning is effected in the direction of arrow in FIG. 6 starting from a point where I=0 and J=0 (the uppermost left point, I; abscissa, J; ordinate) to detect a maximum value. Here, however, the image contains noise. Therefore, the image should be smoothed in advance and, at the same time, a suitable threshold value should be set to remove background noise. In a second step, the coordinate where a maximum value is obtained is denoted by (Ip, Jp), and values of other points are all set to be zero. Then, in a third step, the scanning is effected again in the direction of arrow in FIG. 7 starting from the point where I=J=0. When a value which is not zero is found, 1 is added to J, and the scanning is repeated again starting from I=0. In this case, if there exists the following condition between the coordinates of the neighboring maximum values on the abscissa, the scanning is interrupted at that point, and the coordinate of a point that is the greatest among the maximum values detected thus far is denoted by ($I_1$, $J_1$) and is stored in the memory 19.

$$|I_k - I_{k+1}| > \Delta I$$

where $k = 0, 1, \ldots, N-2$, and $\Delta I$ should be suitably determined with reference to the result.

If ($I_1$, $J_1$) is once found, the maximum values that were detected thus far are all set to be zero in a step 4. The procedure then returns to the first step and is repeated again through up to the fourth step. The scanning is stopped at a moment when the values of the points are all zero. Owing to the above-mentioned operation, positions of all samples are found on the image of FIG. 4. Here, however, the thus found coordinate (I', J') does not represent the coordinate (x', y') that corresponds to all of the picture element points (I, J), but represent coordinate (x', y') that corresponds to limited picture element points maintaining a distance. Therefore, the value of (x', y') that corresponds to the remaining picture element point (I, J) is found by interpolation from the points of (I', J').

Even as for the data of image of FIG. 5 measured by using the read-out gradient magnetic field $-G_{y2}$, quite the same step is repeated to find a coordinate position (I", J") of image that corresponds to a point of the sample, and the value of (x", y") is found for all of the picture element points (I, J).

The method of finding a relationship etween the sample and the image is not limited thereto only; e.g., the center of gravity may be calculated.

In the above-mentioned embodiment, the data i, j, $\Delta_1$ and $\Delta_2$ that represent distortion induced in imaging the object were stored in the memory 20. However, if the error distribution E(I, J) in the static magnetic field, and distributions $\epsilon_x(I, J)$ and $\epsilon_y(I, J)$ of deviations from the straight lines in the gradient magnetic fields are stored in the memory, the amount of correcting of the distortion can be calculated depending upon the strength of the gradient magnetic fields used for imaging the object, and the image can be corrected. Moreover, even when the method other than the applied spin-warp method is used for imaging the object, the amount of distortion can be calculated from the distributions E(I, J), $\epsilon_x(I, J)$ and $\epsilon_y(I, J)$ to correct the distortion. When the applied spin-warp method is employed, furthermore, it is made possible to correct not only the distortion in the reproduced image of the object but also to correct error in the spin density induced by the error in the magnetic field. This will be explained below. If an object having a spin distribution $\rho_0(x, y)$ is measured using the read-out gradient magnetic field $G_{y3}$ followed by the two-dimensional Fourier transform to obtain an image $\rho_0'(x', y')$, there holds the following relationship between $$\rho(x, y) \text{ and } \rho'(x', y'), \quad (12)$$

$$\rho'_0(x', y') = \rho_0(x, y)/J(x, y)$$

where J(x, y) is given by the following equation, $$J(x, y) = \begin{vmatrix} 1 + \dfrac{\partial \epsilon_x}{\partial x} & \dfrac{\partial \epsilon_x}{\partial x} \\ \dfrac{1}{G_y} \dfrac{\partial E}{\partial x} + \dfrac{\partial \epsilon_y}{\partial x} & \dfrac{1}{G_{y3}} \dfrac{\partial E}{\partial x} + \dfrac{\partial \epsilon_y}{\partial x} + 1 \end{vmatrix} \quad (13)$$

When $\epsilon_x$ and E change little, the equation (6) can be expressed as, $$J(x, y) \simeq 1 + \dfrac{\partial \epsilon_x}{\partial x} + \dfrac{\partial \epsilon_y}{\partial x} + \dfrac{1}{G_{y3}} \dfrac{\partial E}{\partial y} \quad (14)$$

Therefore, with the distributions $\epsilon_x(I, J)$, $\epsilon_y(I, J)$ and E(I, J) of $\epsilon_x$, $\epsilon_y$ and E being stored in the memory, the spin density error in the image can be corrected by using the equations (12) and (14).

Using the values of $\epsilon_x(I, J)$, $\epsilon_y(I, J)$ and E(I, J), furthermore, the shimming can be effected for the gradient magnetic field coils 9, 10 and the static magnetic field coil 14.

What is claimed is:

1. A method of measuring error distribution in a static magnetic field and distributions of deviations of gradient magnetic fields from straight lines in first and second directions in an NMR imaging apparatus provided with means for generating the static magnetic field, means for generating the gradient magnetic fields in the first and second directions that are at right angles with each other, and means which generates an RF magnetic field, said method comprising:

(a) a step for placing in said static magnetic field a phantom of which the spin density distribution is known;

(b) a step for exciting the spins of said phantom;

(c) a step for applying to said phantom a gradient magnetic field having a strength-time product which is programmable along said first direction;

(d) a step for reading the NMR signals from said phantom in the presence of a first read-out gradient magnetic field in the first direction along said second direction;

(e) a step for obtaining a first data train by repeating the above-said steps (b) to (d) while successively changing the value of the programmable strength-time product of the gradient magnetic field in the first direction;

(f) a step for obtaining a second data train by repeating the above-said steps (b) to (e) and by changing the read-out gradient magnetic field in step (d) into a second read-out gradient magnetic field of a direction opposite to the first direction;

(g) a step for reconstructing first and second images that represent spin density distributions of said phantom by subjecting said first and second data trains to a two-dimensional Fourier transform, respectively;

(h) a step for finding the distributions of distortion in the first and second reproduced images by comparing the first and second reconstructed images with the known density distribution of said phantom; and (i) a step for finding an error distribution in said static magnetic field from the distributions of distortion of said first and second reconstructed images, and for finding distributions of deviations of said first and second gradient magnetic fields from the straight lines.

2. A measuring method according to claim 1, wherein said step (i) includes a step which finds the error distribution in said static magnetic field from the difference in the distortion distributions of said first and second reconstructed images in the second direction.

3. A measuring method according to claim 1, wherein said step (i) includes a step which finds the distribution of deviation of the gradient magnetic field from a straight line in the second direction based upon the distortion distributions of said first and second reconstructed images in the second direction.

4. A measuring method according to claim 1, wherein said step (i) includes a step which finds the distribution of deviation of the gradient magnetic field from a straight line in the first direction based upon the distortion distribution of said first or second reconstructed image in the first direction.

5. A measuring method according to claim 1, wherein said step (h) includes:

(aa) a step for finding a distortion amount of some picture element points of said NMR imaging apparatus from various positions of said phantom on said first and second reconstructed image; and (bb) a step for finding a distortion amount of each of the remaining picture element points from the distortion amounts obtained in said step (aa) by interpolation calculation.

6. A measuring method according to claim 1, wherein said first and second read-out gradient fields have the same strength.

7. An NMR imaging method comprising:

(a) a step for placing in a static magnetic field a phantom of which the spin density distribution is known;

(b) a step for exciting the spins of said phantom;

(c) a step for applying a gradient magnetic field having a programmable strength-time product to said phantom in a first direction;

(d) a step for reading NMR signals from said phantom in the presence of a first read-out gradient magnetic field of a first direction in a second direction at right angles with said first direction;

(e) a step for obtaining a first data train by repeating the steps (b) to (d) while successively changing the value of the programmable strength-time product of the gradient magnetic field in said first direction;

(f) a step for obtaining a second data train by repeating the steps (b) to (e) by changing the read-out gradient magnetic field in said step (d) into a second read-out gradient field of a second direction opposite to the first direction;

(g) a step for reconstructing first and second spin density distribution images of said phantom by subjecting said first and second data trains to a two-dimensional Fourier transform;

(h) a step for finding distortion distributions of said first and second reconstructed images by comparing said first and second reconstructed images with the known density distribution of said phantom;

(i) a step for finding error distribution in the static magnetic field from the distortion distribution in said first and second reconstructed images, and finding distributions of deviations of the gradient magnetic fields from the straight lines in said first and second directions;

(j) a step for storing the distortion distribution induced in imaging an object by calculating the data relying upon error distribution in the static magnetic field and distributions of deviations of the gradient magnetic fields from the straight lines in the first and second directions;

(k) a step for placing said object in said static magnetic field;

(l) a step for obtaining a third data train by repeating the steps that correspond to said steps (c) to (e) while changing the read-out gradient magnetic field of said first direction to a third read-out gradient magnetic field;

(m) a step for reconstructing a third image that represents the spin density distribution of said object by subjecting said third data train to the two-dimensional Fourier transform; and (n) a step for correcting the distortion of said third image by using the data of said distortion distribution.

8. An NMR imaging method according to claim 7, wherein said step (n) calculates by interpolation the spin density of a coordinate indicated by the data that represent said distortion distribution based upone the values of said third image at a plurality of picture element points near said coordinate.

9. A method of measuring error distribution in a static magnetic field and distributions of deviations of gradient magnetic fields from straight lines in first and second directions in an NMR imaging apparatus provided with means for generating the static magnetic field, means for generating the gradient magnetic fields in the first and second directions that are at right angles with each other, and means which generates an RF magnetic field, said method comprising:

(a) a step for placing in said static magnetic field a phantom of which the spin density distribution is known;

(b) a step for exciting the spins of said phantom;

(c) a step for applying to said phantom a gradient magnetic field having a strength-time product which is programmable along said first direction;

(d) a step for reading the NMR signals from said phantom in the presence of a first read-out gradient magnetic field in the first direction along said second direction;

(e) a step for obtaining a first data train by repeating the above-said steps (b) to (d) while successively changing the value of the programmable strength-time product of the gradient magnetic field in the first direction;

(f) a step for obtaining a second data train by repeating the above-said steps (b) to (e) and by changing the read-out gradient magnetic field in step (d) into a second read-out gradient magnetic field having a different strength than that of said first read-out gradient magnetic field;

(g) a step for reconstructing first and second images that represent spin density distributions of said phantom by subjecting said first and second data trains to a two-dimensional Fourier transform, respectively;

(h) a step for finding the distributions of distortion in the first and second reproduced images by comparing the first and second reconstructed images with the known density distribution of said phantom; and (i) a step for finding an error distribution in said static magnetic field from the distributions of distortion of said first and second reconstructed images, and for finding distributions of deviations of said first and second gradient magnetic fields from the straight lines.

* * * * *